US012812800B2

(12) United States Patent
Li et al.

(10) Patent No.: US 12,812,800 B2
(45) Date of Patent: Nov. 24, 2026

(54) FOLDABLE ASSEMBLY AND FOLDABLE DISPLAY DEVICE

(71) Applicant: Honor Device Co., Ltd., Shenzhen (CN)

(72) Inventors: Tuo Li, Shenzhen (CN); Dengpan Yu, Shenzhen (CN); Wenxing Yao, Shenzhen (CN)

(73) Assignee: HONOR DEVICE CO., LTD., Shenzhen (CN)

( * ) Notice: Subject to any disclaimer, the term of this patent is extended or adjusted under 35 U.S.C. 154(b) by 55 days.

(21) Appl. No.: 18/869,093

(22) PCT Filed: Apr. 26, 2023

(86) PCT No.: PCT/CN2023/090902
§ 371 (c)(1),
(2) Date: Nov. 25, 2024

(87) PCT Pub. No.: WO2024/001480
PCT Pub. Date: Jan. 4, 2024

(65) Prior Publication Data

US 2025/0324524 A1 Oct. 16, 2025

(30) Foreign Application Priority Data

Jul. 1, 2022 (CN) ......................... 202210768377.6

(51) Int. Cl.
*H05K 5/02* (2006.01)
*F16C 11/04* (2006.01)
(Continued)

(52) U.S. Cl.
CPC ......... *H05K 5/0217* (2013.01); *G06F 1/1616* (2013.01); *G06F 1/1652* (2013.01);
(Continued)

(58) Field of Classification Search
CPC .... G06F 1/1616; G06F 1/1652; G06F 1/1681; G06F 1/1637; G06F 1/1641;
(Continued)

(56) References Cited

U.S. PATENT DOCUMENTS 7,957,769 B2 * 6/2011 Mochizuki ............ H04M 1/185 455/566
10,188,004 B2 * 1/2019 Yeh ....................... G06F 1/1616
(Continued)

FOREIGN PATENT DOCUMENTS

CN 209545627 U 10/2019
CN 110784567 A 2/2020
(Continued)

*Primary Examiner* — Allen L Parker
*Assistant Examiner* — Martin Antonio Asmat Uceda
(74) *Attorney, Agent, or Firm* — Conley Rose, P.C.

(57) ABSTRACT

A foldable assembly and a foldable display device. The foldable display device includes the foldable assembly. The foldable assembly includes a rotating shaft mechanism and a connecting mechanism. The rotating shaft mechanism includes a bump and a rotating shaft substrate. The bump is arranged at an end portion of the rotating shaft substrate in a length direction. The connecting mechanism includes two support members, the two support members are respectively connected to two sides of the rotating shaft substrate in a width direction, and the two support members are respectively rotatable relative to the rotating shaft substrate, so that the foldable assembly is switched between an unfolded state and a folded state.

20 Claims, 9 Drawing Sheets

(51) Int. Cl.

| | |
|---|---|
| ***G06F 1/16*** | (2006.01) |
| ***G09F 9/30*** | (2006.01) |
| ***H04M 1/02*** | (2006.01) |

(52) U.S. Cl.

CPC ............ *G06F 1/1681* (2013.01); *G09F 9/301* (2013.01); *H04M 1/0268* (2013.01); *H05K 5/0226* (2013.01); *F16C 11/04* (2013.01)

(58) Field of Classification Search

CPC .... G06F 1/1656; G09F 9/301; H04M 1/0268; H04M 1/0216; H04M 1/185; H05K 5/0226; H05K 5/0217; F16C 11/04

See application file for complete search history.

(56) References Cited

U.S. PATENT DOCUMENTS

| | | | | |
|---|---|---|---|---|
| 10,365,691 | B2 * | 7/2019 | Bae | G06F 1/1652 |
| 10,550,880 | B2 * | 2/2020 | Hsu | E05D 11/082 |
| 11,240,920 | B2 * | 2/2022 | Jeon | G06F 1/1641 |
| 11,755,067 | B2 * | 9/2023 | Park | G06F 1/1618 361/679.27 |
| 12,449,838 | B2 * | 10/2025 | Liu | G06F 1/1616 |
| 2011/0063783 | A1 * | 3/2011 | Shim | G06F 1/1615 361/679.01 |
| 2020/0267245 | A1 * | 8/2020 | Li | G06F 1/1681 |
| 2020/0352038 | A1 * | 11/2020 | Kim | H04M 1/0216 |
| 2020/0382627 | A1 | 12/2020 | Park et al. | |
| 2022/0183170 | A1 | 6/2022 | Campbell et al. | |
| 2022/0247846 | A1 * | 8/2022 | Lim | G06F 1/1624 |
| 2022/0248548 | A1 | 8/2022 | Zhong et al. | |
| 2022/0321683 | A1 | 10/2022 | Luo et al. | |
| 2023/0018137 | A1 | 1/2023 | Yuan et al. | |
| 2024/0004425 | A1 * | 1/2024 | Liu | G06F 1/1616 |
| 2024/0098915 | A1 | 3/2024 | Zhang et al. | |
| 2024/0129385 | A1 * | 4/2024 | Fan | H04M 1/18 |
| 2024/0129400 | A1 * | 4/2024 | Park | G06F 1/1652 |
| 2024/0195900 | A1 | 6/2024 | Li | |
| 2026/0010207 | A1 * | 1/2026 | Zhang | G06F 1/1656 |

FOREIGN PATENT DOCUMENTS

| | | | | | |
|---|---|---|---|---|---|
| CN | 210380956 | U | | 4/2020 | |
| CN | 111147630 | A | | 5/2020 | |
| CN | 210518451 | U | | 5/2020 | |
| CN | 111885222 | A | | 11/2020 | |
| CN | 211981915 | U | | 11/2020 | |
| CN | 212850572 | U | | 3/2021 | |
| CN | 113450646 | A | * | 9/2021 | G09F 9/301 |
| CN | 113470515 | A | | 10/2021 | |
| CN | 113888960 | A | | 1/2022 | |
| CN | 114051064 | A | | 2/2022 | |
| CN | 114141145 | A | | 3/2022 | |
| CN | 114263674 | A | | 4/2022 | |
| KR | 20190046578 | A | | 5/2019 | |
| KR | 20200114958 | A | | 10/2020 | |

* cited by examiner

FOLDABLE ASSEMBLY AND FOLDABLE DISPLAY DEVICE

CROSS-REFERENCE TO RELATED APPLICATIONS

This is a U.S. National Stage of International Application No. PCT/CN2023/090902 filed on Apr. 26, 2023, which claims priority to Chinese Patent Application No. 202210768377.6, filed with the China National Intellectual Property Administration on Jul. 1, 2022, both of which are incorporated herein by reference in their entireties.

TECHNICAL FIELD

This application relates to the field of foldable device technologies, and in particular, to a foldable assembly and a foldable display device.

BACKGROUND

With the development of display technologies, a foldable display device is increasingly favored by users because the foldable display device can obtain a larger display area in an unfolded state and better portability in a folded state. The foldable display device includes a flexible screen, a rotating shaft, and two housings. The two housings are rotatably connected by the rotating shaft, and the flexible screen is laid on the two housings. The two housings are swung in opposite directions, so that unfolding and folding operations of the foldable display device can be implemented. When the foldable display device is in the folded state, the two housings flip to the same side of the rotating shaft, that is, the rotating shaft is located on one side edge of the foldable display device. In the folded state, if the foldable display device falls off, the foldable display device is likely to be in an oblique downward falling state during falling. As a result, a corner of the foldable display device is first hit. Because the rotating shaft is located on one side edge of the foldable display device, one end of the rotating shaft is likely to be first hit, resulting in inward collapse of the rotating shaft, which squeezes the flexible screen and causes damage to the flexible screen.

To resolve the foregoing problems, at present, there are generally two solutions. One solution is to arrange a thicker rotating shaft, so that the rotating shaft has stronger impact resistance. However, in this solution, a weight of an entire machine is larger, and to match a size of the rotating shaft, a thickness of the entire machine is increased, leading to poor portability and a decrease in the use experience. Another solution is to arrange a rounded corner at one end of the rotating shaft, and the rounded corner on a side on which the housing is connected to the rotating shaft is enlarged, so that the housing is hit before the rotating shaft or the housing and the rotating shaft are hit simultaneously after the foldable display device falls off, to share an impact force on the rotating shaft through the housing. However, in this arrangement, angles of the rounded corners on the two sides of the housing are different, resulting in an inconsistent ratio of two sides of the foldable display device in the folded state and reduced use experience.

It can be learned from the above that, at present, a problem of damage to the flexible screen caused by the inward collapse of the rotating shaft after being hit cannot be resolved without changing the appearance of the foldable display device.

SUMMARY

This application provides a foldable assembly and a foldable display device. Both the foldable assembly and the foldable display device can resolve a problem of damage to a flexible screen caused by inward collapse of a rotating shaft under impact to a certain extent.

The technical solutions are as follows:

According to a first aspect, this application provides a foldable assembly, including: a rotating shaft mechanism and a connecting mechanism, where

- the rotating shaft mechanism comprises a bump and a rotating shaft substrate, and the bump is arranged at an end portion of the rotating shaft substrate in a length direction;
- the connecting mechanism comprises two support members, the two support members are respectively connected to two sides of the rotating shaft substrate in a width direction, and the two support members are respectively rotatable relative to the rotating shaft substrate, so that the foldable assembly is switched between an unfolded state and a folded state; and
- a stop surface is arranged on one side of the support member close to the rotating shaft substrate, and in the folded state, the bump and the stop surface are spaced apart and opposite to each other in a thickness direction of the rotating shaft substrate.

The foldable assembly provided in this application can be applied to a foldable display device. When the foldable assembly is applied to the foldable display device, a to-be-supported object is a flexible screen in the foldable display device, that is, a support member is configured to support the flexible screen. The foldable assembly is configured to drive the flexible screen to switch between the folded state and the unfolded state. In the folded state, the bump arranged on the rotating shaft substrate is spaced apart and opposite to the stop surface on the support member. If the foldable display device falls off in the folded state, after the rotating shaft mechanism is hit, the rotating shaft substrate drives the bump to move in a direction close to the flexible screen, that is, move forward in the thickness direction of the rotating shaft substrate. After the bump moves by a certain distance, the bump comes into contact with the stop surface. According to an aspect, the stop surface prevents the bump from continuing to move toward the flexible screen, thereby protecting the flexible screen. According to another aspect, an impact force received by the rotating shaft mechanism is transmitted to the support member through contact between the bump and the stop surface, so that the impact force is further dispersed by the support member, thereby reducing the impact force transmitted to the flexible screen, to protect the flexible screen.

When the foldable display device falls off and the rotating shaft mechanism is first hit, the stop surface prevents the rotating shaft mechanism from continuing to move toward the flexible screen, and the impact force is dispersed and absorbed by the support member to reduce the impact force that may be transmitted to the flexible screen. Therefore, a problem of damage to the flexible screen caused by the rotating shaft mechanism can be resolved to a certain extent.

In some implementations, the support member includes a support substrate and a support block, the support substrate is connected to one side of the rotating shaft substrate in the width direction, and the support substrate is rotatable relative to the rotating shaft substrate. The support block is arranged on the support substrate, the support block is arranged on one side of the support substrate close to the rotating shaft substrate, and one side surface of the support block is the stop surface.

In some implementations, the rotating shaft substrate includes a support surface, the support surface is configured to support a to-be-supported object, and the bump is arranged on the support surface of the rotating shaft substrate.

In some implementations, one bump is arranged at two ends of the rotating shaft substrate in the length direction respectively, the stop surface is arranged at two ends of each of the support members in the length direction, and in the folded state, each bump and the stop surfaces of the two support members are spaced apart and opposite to each other in the thickness direction of the rotating shaft substrate.

In some implementations, two ends of the rotating shaft substrate in the length direction are respectively provided one of the bumps, one of the two support members is provided with one of the stop surfaces at one end of the rotating shaft substrate in the length direction, and an other of the two support members is provided with one of the stop surfaces at an other end of the rotating shaft substrate in the length direction; and in the folded state, one of the bumps and the stop surface of one of the support members are spaced apart and opposite to each other in the thickness direction of the rotating shaft substrate, and the other of the bumps and the stop surface of the other of the support members are spaced apart and opposite to each other in the thickness direction of the rotating shaft substrate.

In some implementations, two bumps are arranged at at least one end of the rotating shaft substrate in the length direction, the two bumps are spaced apart in the width direction of the rotating shaft substrate, and the stop surface is arranged at end portions of the two support members corresponding to the bumps in the length direction of the rotating shaft substrate; and in the folded state, one of the bumps and the stop surface of one of the support members are spaced apart and opposite to each other in the thickness direction of the rotating shaft substrate, and the other of the bumps and the stop surface of the other of the support members are spaced apart and opposite to each other in the thickness direction of the rotating shaft substrate.

In some implementations, the bump is arranged on a side surface of the rotating shaft substrate in the width direction, the support member is provided with a groove, and an inner wall of one side of the groove forms the stop surface; and in the folded state, the bump is located in the groove and is spaced apart and opposite to the stop surface in the thickness direction of the rotating shaft substrate.

In this arrangement, because the bump is arranged on the side surface of the rotating shaft substrate in the width direction, the arrangement of the bump does not increase a thickness of the rotating shaft mechanism, so that the thickness of the rotating shaft mechanism is smaller.

In some implementations, the rotating shaft mechanism further comprises a decorative member, and the decorative member is mounted on an outer side of the rotating shaft substrate.

In this arrangement, because the decorative member is mounted on the outer side of the rotating shaft substrate, the decorative member can be used to improve aesthetics of the rotating shaft mechanism.

In some implementations, the decorative member comprises an accommodating cavity, at least a part of a structure of the rotating shaft substrate is located in the accommodating cavity, and at least a part of a structure of the bump is located outside the accommodating cavity.

In this arrangement, the accommodating cavity is arranged inside the decorative member, so that a coverage range of the decorative member for the rotating shaft substrate is larger, and a thickness of an overall structure of the decorative member and the rotating shaft substrate is smaller.

In some implementations, the rotating shaft substrate comprises a main body and a connecting body; an end portion of the main body in the length direction is provided with the connecting body; the bump is arranged on the connecting body; and a thickness of the connecting body is greater than a thickness of the main body.

Because the bump is connected to the connecting body, and a relative thickness of the connecting body is thicker, the structural rigidity of the rotating shaft substrate is stronger at a position in which the bump is arranged, and the impact resistance is stronger.

In some implementations, a bracket is provided at an end portion of the decorative member in the length direction of the rotating shaft substrate, the connecting body is limited in the bracket, and the bump protrudes from the bracket in the thickness direction of the rotating shaft substrate.

In this arrangement, according to an aspect, the connecting body is limited by the bracket, and according to another aspect, the connecting body with a larger thickness is placed in the bracket, so that an overall structure of the decorative member and the rotating shaft substrate has a smaller thickness, which is convenient to be applied to a foldable display device with a smaller thickness.

In some implementations, a buffer structure is arranged on the stop surface and/or the bump, and in the folded state, the buffer structure is located between the stop surface and the bump.

Through the foregoing arrangement, the impact force transmitted by the bump to the stop surface may be buffered to a certain extent by using the buffer structure, thereby reducing the impact force received by the support member provided with the stop surface, and improving an anti-impact capability of the foldable assembly.

In some implementations, the buffer structure includes a flexible buffer pad.

Through its own flexible characteristic, the flexible buffer pad deforms under extrusion of the bump and the stop surface during movement of the bump toward the stop surface, thereby absorbing part of the impact force.

In some implementations, the buffer structure is mounted on the bump, the buffer structure includes a buffer plate and an elastomer, the buffer plate and the bump are spaced apart and opposite to each other in the thickness direction of the rotating shaft substrate, the elastomer is located between the buffer plate and the bump, and the elastomer is connected to the buffer plate and the bump respectively, and in the folded state, the buffer plate and the stop surface are spaced apart and opposite to each other in the thickness direction of the rotating shaft substrate.

Through the foregoing arrangement, during the movement of the bump toward the stop surface, the buffer plate first comes into contact with the stop surface. The arrangement of the buffer plate can increase a contact area with the stop surface, and the elastomer can compress and deform to absorb part of the impact force. In addition, after the impact ends, the elastomer may push the rotating shaft substrate to move away from the flexible screen through elasticity of the elastomer, so that the rotating shaft substrate can be reset.

According to a second aspect, this application provides a foldable display device, including: a flexible screen and the foldable assembly provided in any one of the foregoing implementations, where the flexible screen is laid on two support members in the foldable assembly and covers the support surface of the rotating shaft substrate.

The foldable display device provided in this application includes the foregoing foldable assembly. Therefore, when the foldable display device falls off in the folded state, if the rotating shaft mechanism is first hit, the stop surface in the foldable mechanism prevents the rotating shaft mechanism from continuing to move toward the flexible screen, and the impact force is dispersed and absorbed by the support member, to reduce the impact force that may be transmitted to the flexible screen. Therefore, the problem of damage to the flexible screen caused by the rotating shaft mechanism can be resolved to a certain extent.

Figure 1:
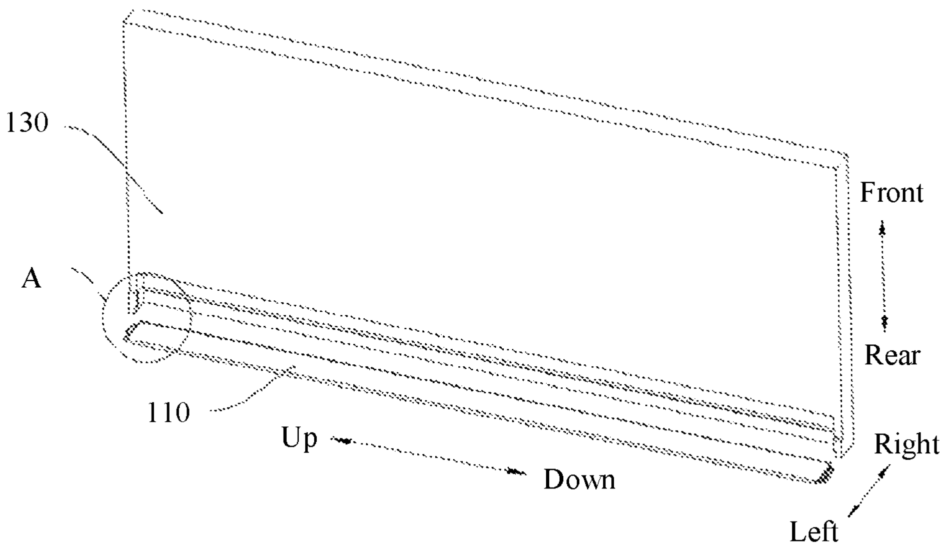
FIG. 1 is a schematic exploded view of a rotating shaft mechanism and a support member in a foldable assembly according to an embodiment of this application.

The meanings represented by reference numerals are as follows:

110. Rotating shaft substrate; 111. Main body; 112. Connecting body; 120. Bump; 130. Support member; 131. Stop surface; 132. Support block; 133. Groove; 134. Support substrate; 140. Decorative member; 141. Accommodating cavity; 142. Bracket; 143. Separating plate; 151. Flexible buffer pad; 152. Buffer plate; 153. Elastomer.

DESCRIPTION OF EMBODIMENTS

To make objectives, technical solutions, and advantages of this application clearer, implementations of this application are further described below in detail with reference to the accompanying drawings.

It is to be understood that "plurality of" mentioned in this application refers to two or more. In the descriptions of this application, "/" represents "or" unless otherwise specified. For example, A/B may represent A or B. In this specification, "and/or" describes only an association relationship for describing associated objects and represents that three relationships may exist. For example, A and/or B may represent the following three cases: Only A exists, both A and B exist, and only B exists. In addition, for ease of describing the technical solutions in this application clearly, terms such as "first" and "second" are used to distinguish same or similar items having basically same functions and roles. A person skilled in the art may understand that the terms, such as "first" and "second", do not limit a quantity or an execution sequence, and the terms, such as "first" and "second", do not indicate a definite difference.

A foldable assembly and a foldable display device provided in embodiments of this application are described in detail below. In the accompanying drawings of this application, all leads with arrows point to a surface of a device, and all leads with dots point to a device or a region.

FIG. 1 is a schematic diagram of a rotating shaft substrate 110, a bump 120, and one of support members 130 in a foldable assembly according to this embodiment. Because both two support members 130 are shown in the figure to shield most of a structure of the rotating shaft substrate 110, only one support member 130 is retained, and the two support members 130 are symmetrically distributed relative to the rotating shaft substrate 110.

Figure 2:
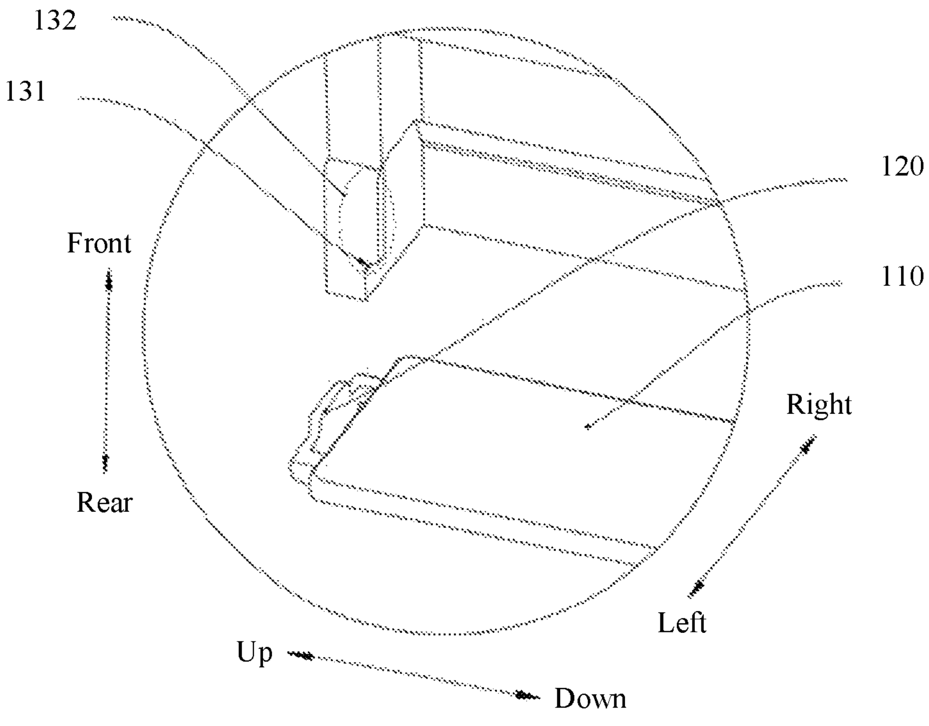
FIG. 2 is an enlarged view at A in FIG. 1.

As shown in FIG. 1 and FIG. 2, this embodiment provides the foldable assembly, including a rotating shaft mechanism and a connecting mechanism. The rotating shaft mechanism includes the bump 120 and the rotating shaft substrate 110. The bump 120 is arranged at least at an end portion of the rotating shaft substrate 110 in a length direction. The connecting mechanism includes two support members 130. The two support members 130 are respectively connected to two sides of the rotating shaft substrate 110 in a width direction, and the two support members 130 are respectively rotatable relative to the rotating shaft substrate 110, so that the foldable assembly is switched between an unfolded state and a folded state. In the unfolded state, the two support members 130 are respectively arranged on two sides of the rotating shaft substrate 110 in the width direction. In the folded state, the two support members 130 are rotated to one side of the rotating shaft substrate 110 in a thickness direction. A stop surface 131 is arranged on one side of the support member 130 close to the rotating shaft substrate. In the folded state, the bump 120 and the stop surface 131 are spaced apart and opposite to each other in the thickness direction of the rotating shaft substrate 110.

There may be one or more bumps 120. When there is one bump 120, the bump 120 is arranged at one end of the rotating shaft substrate 110 in the length direction. When there are two bumps 120, one bump 120 is arranged at each of two ends of the rotating shaft substrate 110 in the length direction. Alternatively; the two bumps 120 are both arranged at the same end of the rotating shaft substrate 110 in the length direction.

In the two support members 130, the stop surface 131 may be arranged on only one support member 130, or the stop surface 131 may be arranged both on the two support members 130. When the stop surface 131 is arranged on only one support member 130, a quantity of stop surfaces 131 is equal to a quantity of the bumps 120, and the stop surfaces are in a one-to-one correspondence to the bumps. In other words, in the folded state, one bump 120 is spaced apart and opposite to only one stop surface 131 in the thickness direction of the rotating shaft substrate 110. When the stop surface 131 is arranged both on the two support members 130, quantities of stop surfaces 131 arranged on the two support members 130 may be same or different. A sum of the quantities of stop surfaces 131 on the two support members 130 is greater than or equal to the quantity of the bumps 120. For example, when there is one bump 120, one stop surface 131 may be arranged both on the two support members 130, that is, the sum of the stop surfaces 131 is two. In the folded state, one bump 120 is respectively spaced apart and opposite to two stop surfaces 131 in the thickness direction of the rotating shaft substrate 110. If the two support members 130 are respectively mounted on left and right sides of the rotating shaft substrate 110, in the folded state, the stop surface 131 on the support member 130 on the left side is spaced apart and opposite to a left partial region of the bump 120 in the thickness direction of the rotating shaft substrate 110, and the stop surface 131 on the support member 130 on the right side is spaced apart and opposite to a right partial region of the bump in the thickness direction of the rotating shaft substrate 110.

In other words, the two support members 130 may both be provided with the stop surface 131, or one support member 130 is provided with the stop surface 131, and the other support member 130 is not provided with the stop surface 131. The bump 120 and the stop surface 131 are spaced apart and opposite to each other in the thickness direction of the rotating shaft substrate 110 to facilitate rotation of the support member 130 relative to the rotating shaft mechanism. In the folded state, a spacing between the bump 120 and a corresponding stop surface 131 ranges from 0.1 mm to 0.5 mm. For example, the spacing may be 0.1 mm, 0.15 mm, 0.2 mm, 0.3 mm, 0.35 mm, 0.5 mm, or the like.

For each structure described in this embodiment, the length direction, the width direction, and the thickness direction are all based on the length direction, the width direction, and the thickness direction of the rotating shaft substrate 110. As shown in FIG. 2, the length direction of the rotating shaft substrate 110 is referred to as an up-down direction, and two ends of the rotating shaft substrate 110 in the length direction are respectively an upper end and a lower end. The two support members 130 are respectively located on left and right sides of the rotating shaft substrate 110 in the unfolded state, and a left-right direction is the width direction of the rotating shaft substrate 110. The thickness direction of the rotating shaft substrate 110 is referred to as a front-rear direction. In the folded state, the two support members 130 are both located on a front side of the rotating shaft substrate 110, and one side facing away from the front side is a rear side of the rotating shaft substrate 110. In the folded state, the stop surface 131 is located on a front side of the bump 120, so that the bump 120 comes into contact with the stop surface 131 after moving forward.

The foldable assembly can be applied to a foldable display device. When the foldable assembly is applied to the foldable display device, the support member 130 is configured to support a flexible screen. The flexible screen is laid on the two support members 130 and is supported by the two support members 130 on the front side of the rotating shaft substrate 110 in the thickness direction. A front side surface of the rotating shaft substrate is a support surface. The foldable assembly is configured to drive the flexible screen to switch between the folded state and the unfolded state. In the folded state, the bump 120 arranged on the rotating shaft substrate 110 is spaced apart and opposite to the stop surface 131 on the support member 130 in the thickness direction of the rotating shaft substrate 110. If the foldable display device falls off in the folded state, after the rotating shaft mechanism is hit, the rotating shaft substrate 110 drives the bump 120 to move toward the flexible screen, that is, move forward in the thickness direction of the rotating shaft substrate 110. After the bump 120 moves by a certain distance, the bump 120 comes into contact with the stop surface 131. On one hand, the stop surface 131 prevents the bump 120 from continuing to move toward the flexible screen, thereby protecting the flexible screen to a certain extent. On the other hand, through contact between the bump 120 and the stop surface 131, an impact force received by the rotating shaft mechanism is transmitted to the support member 130, so that the impact force is further dispersed through the support member 130, thereby reducing the impact force transmitted to the flexible screen, to protect the flexible screen.

When the foldable display device falls off and the rotating shaft mechanism is first hit, the stop surface 131 prevents the rotating shaft mechanism from continuing to move toward the flexible screen, and the impact force is dispersed and absorbed by the support member 130 to reduce the impact force that may be transmitted to the flexible screen. Therefore, a problem of damage to the flexible screen caused by the rotating shaft mechanism can be resolved to a certain extent.

In addition, in addition to being applied to the foldable display device, the foldable assembly provided in this embodiment may be further applied to a furniture appliance having a foldable structure, such as a refrigerator, a cabinet, or a door. When the foldable assembly is applied to the refrigerator, one support member 130 is connected to a refrigerator body of the refrigerator, and the other support member 130 is connected to a refrigerator door. The foldable assembly can improve an anti-impact capability of a joint between the refrigerator door and the refrigerator body. When the foldable assembly is applied to the cabinet, one support member 130 is connected to a cabinet body of the cabinet, and the other support member 130 is connected to a cabinet door of the cabinet. The foldable assembly can improve an anti-impact capability of a joint between the cabinet body and the cabinet door. When the foldable assembly is applied to the door, one support member 130 is connected to a door frame, and the other support member

130 is connected to a door body. The foldable assembly can improve an anti-impact capability of a joint between the door body and the door frame. Further descriptions are provided below by using an example in which the foldable assembly is applied to the foldable display device.

Figure 3:
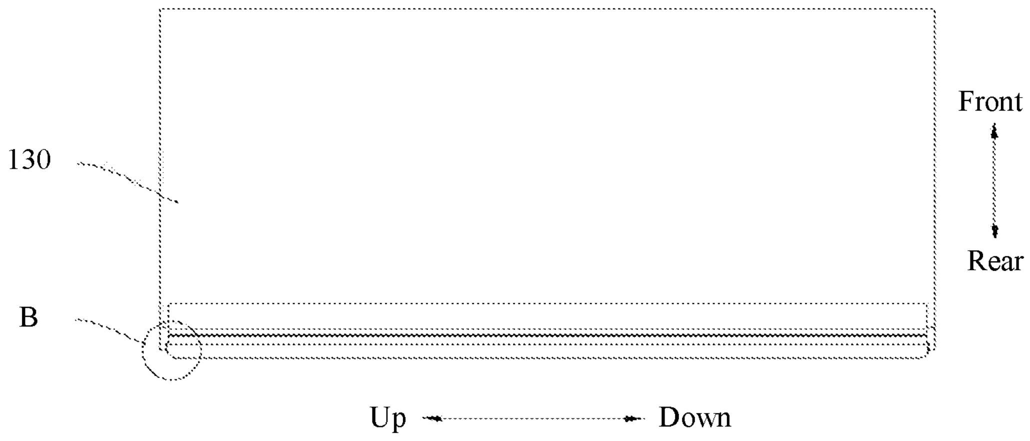
FIG. 3 is a schematic structural diagram of a support member and a rotating shaft mechanism in a folded state in a foldable assembly from one perspective according to an embodiment of this application.
Figure 4:
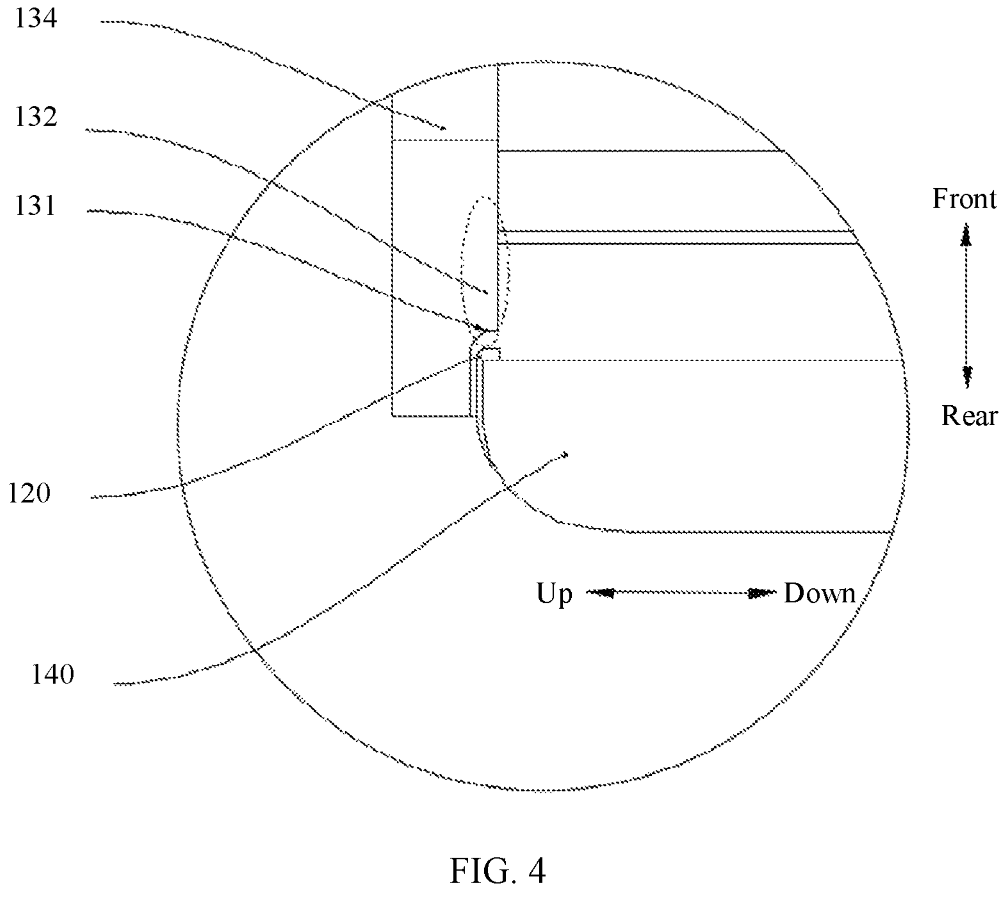
FIG. 4 is an enlarged view at B in FIG. 3.

As shown in FIG. 2 to FIG. 4, in a specific implementation, the support member 130 includes a support block 132, and one side surface of the support block 132 is the stop surface 131. Specifically, when the foldable assembly is in the folded state, a side surface of one side of the support block 132 facing the bump 120 is the stop surface 131.

As shown in FIG. 4, the support member 130 further includes a support substrate 134, and the support substrate 134 is connected to one side of the rotating shaft substrate 110 in the width direction. For example, in the two support members 130, the support substrate 134 of one support member 130 is connected to a left side of the rotating shaft substrate 110, and the support substrate 134 of the other support member 130 is connected to a right side of the rotating shaft substrate 110. The support substrate 134 is rotatably connected to the rotating shaft substrate 110. The support block 132 is arranged on one side of the support substrate 134 close to the rotating shaft substrate 110. In a feasible arrangement, the support block 132 and the support substrate 134 may be an integrated structure prepared by an integrated molding and manufacturing process. Certainly, in another arrangement, the support block 132 and the support substrate 134 may be separate structures, and may be fixedly connected by bolting, bonding, or the like.

As shown in FIG. 4, in a feasible arrangement, the stop surface 131 is an arc-shaped surface. Still referring to FIG. 4, the front side surface of the bump 120 may also be arranged as an arc-shaped surface. In this arrangement, a contact area between the bump 120 and the stop surface 131 can be increased. Optionally, the stop surface 131 extends toward the support substrate 134, and the stop surface 131 is finally connected to the support member 130. Through this arrangement, a transition surface between the support block 132 and the support substrate 134 is also an arc-shaped surface, that is, there is an arc transition between the support block 132 and the support substrate 134. When the bump 120 hits the support block 132, formation of a stress concentration region between the support block 132 and the support substrate 134 may be avoided.

The front side surface of the rotating shaft substrate 110 is the support surface configured to support a to-be-supported object. When the foldable assembly is applied to the foldable display device, the to-be-supported object is the flexible screen. In other words, in the foldable display device, the flexible screen and the support surface of the rotating shaft substrate 110 are arranged opposite to each other in the thickness direction of the rotating shaft substrate 110. The support surface of the rotating shaft substrate 110 may be in direct contact with the flexible screen, or another member is mounted on the support surface of the rotating shaft substrate 110 to enable the support surface to indirectly support the flexible screen. For example, the rotating shaft mechanism further includes a hinge structure, and the support members 130 are rotatably connected to the rotating shaft substrate 110 through the hinge structure respectively. The hinge structure is mounted on the support surface of the rotating shaft substrate 110.

As shown in FIG. 4, in some implementations, the bump 120 is arranged on the support surface of the rotating shaft substrate 110, and the bump 120 protrudes forward. In this arrangement, a distance between the bump 120 and an axis of the rotating shaft substrate 110 is smaller, or the bump 120 is located on a front side of a position of an axis of the rotating shaft substrate 110. When the rotating shaft substrate 110 is hit, a position close to the axis is more likely to be subjected to a larger impact force. When the rotating shaft is hit at the position close to the axis, because the bump 120 is located at a position close to the axis of the rotating shaft substrate 110 or on the front side of the axis, a speed at which the impact force is transmitted to the bump 120 is faster, and a larger impact force is received by the stop surface 131. Therefore, stopping the bump 120 by the stop surface 131 can more effectively prevent the rotating shaft mechanism from moving toward the front side.

Figure 5:
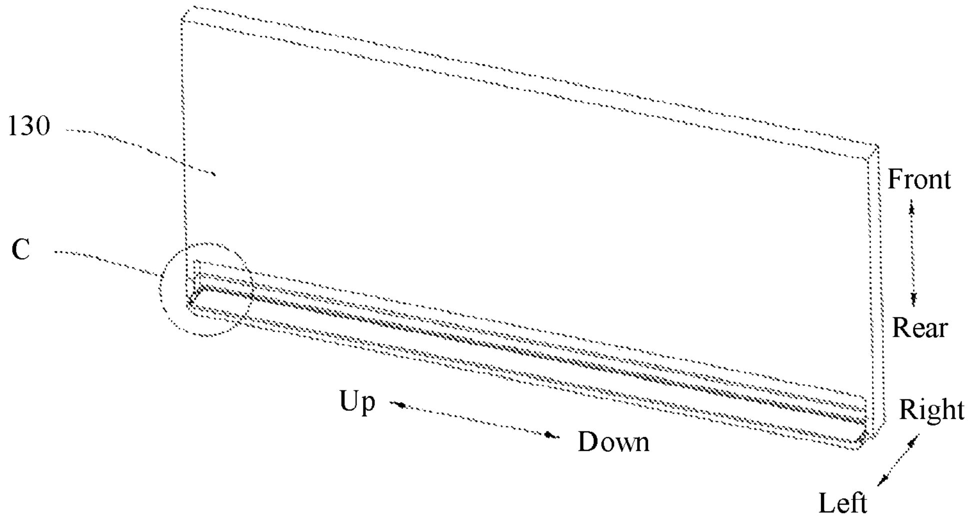
FIG. 5 is a schematic structural diagram of a support member and a rotating shaft mechanism in a folded state in a foldable assembly from another perspective according to an embodiment of this application.
Figure 6:
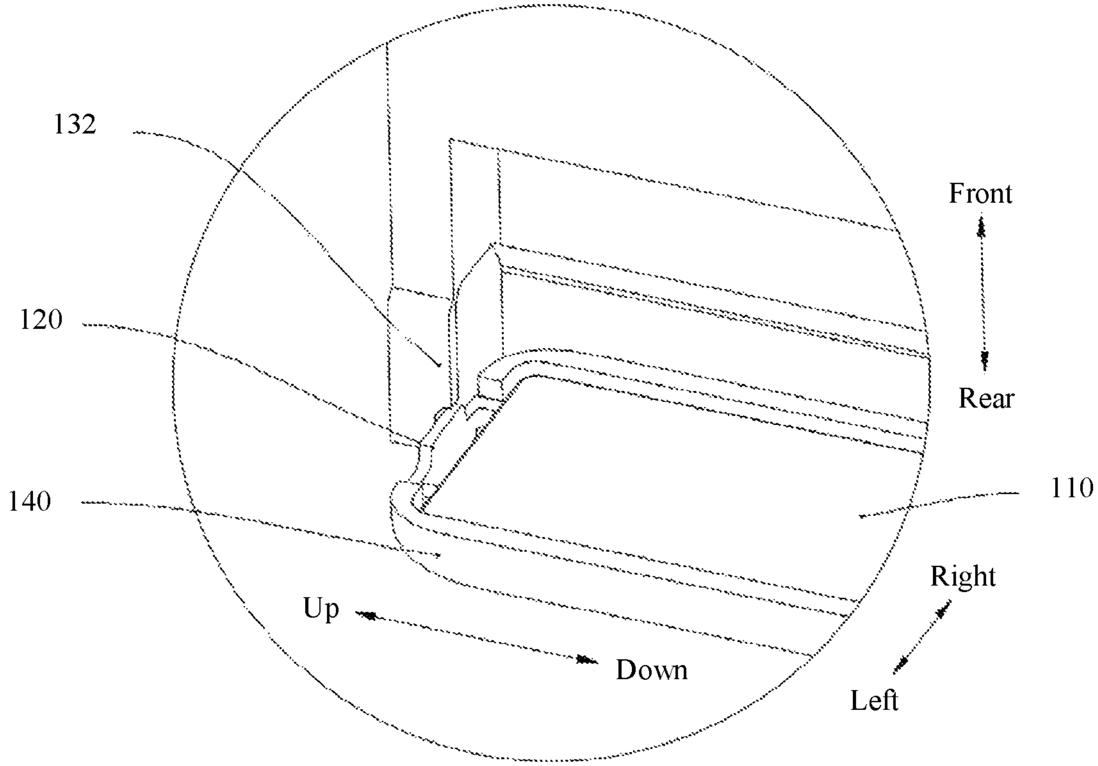
FIG. 6 is an enlarged view at C in FIG. 5.
Figure 7:
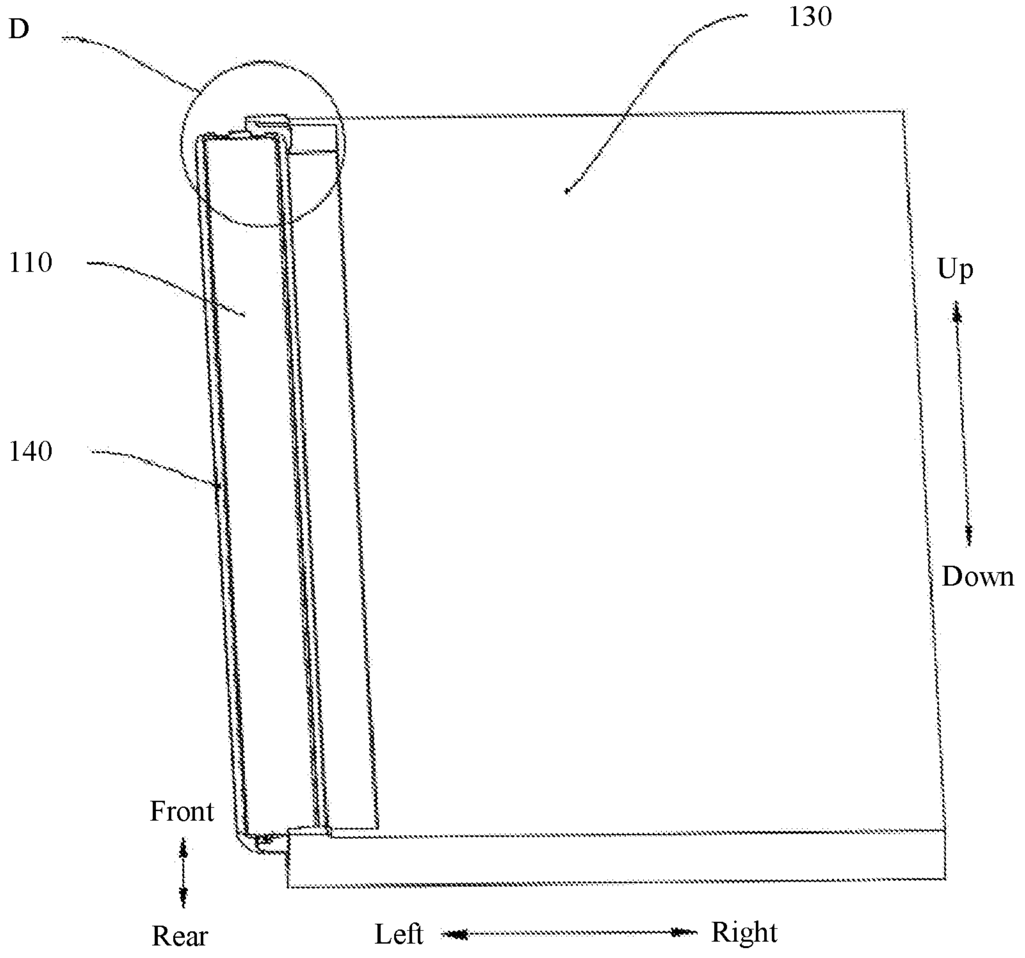
FIG. 7 is a schematic structural diagram of a support member and a rotating shaft mechanism in an unfolded state in a foldable assembly according to an embodiment of this application.
Figure 8:
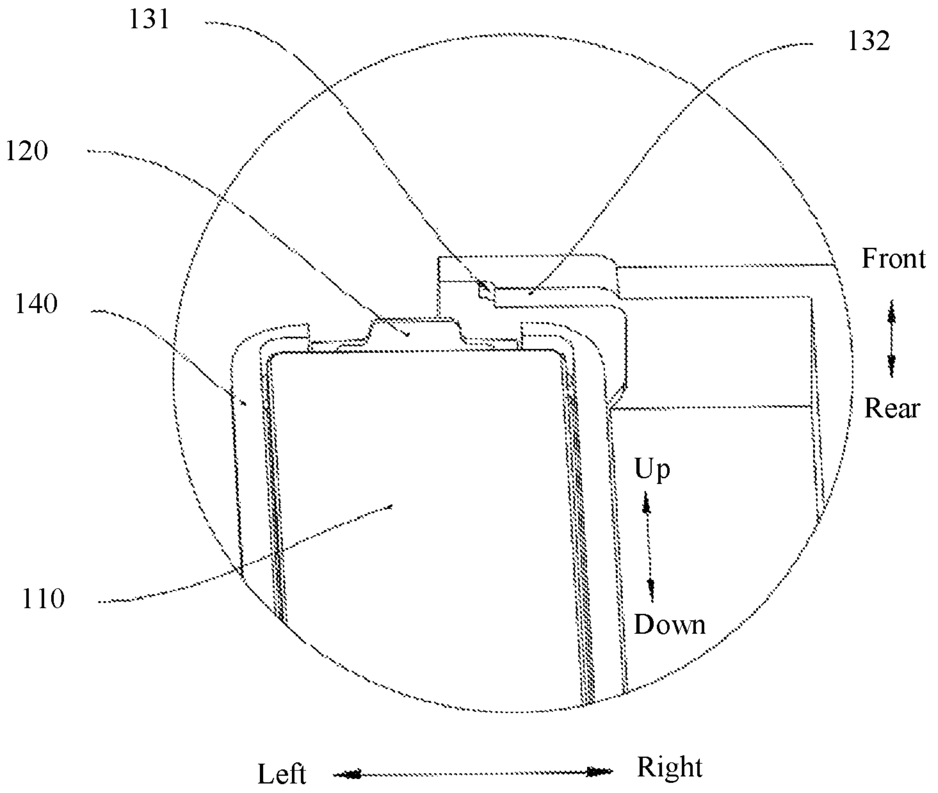
FIG. 8 is an enlarged view at D in FIG. 7.

As shown in FIG. 5 and FIG. 6, in the folded state, the stop surface 131 is located on the front side of the bump 120, and the stop surface 131 and the bump 120 are spaced apart and opposite to each other in the thickness direction of the rotating shaft substrate 110. When a support assembly is switched from the folded state to the unfolded state, as the support member 130 rotates, the stop surface 131 gradually moves away from the front side of the bump 120. As shown in FIG. 7 and FIG. 8, in the unfolded state, the stop surface 131 is located on the left side or the right side of the bump 120. Specifically, if the stop surface 131 is arranged on the support member 130 on the left side, the stop surface 131 is located on the left side of the bump 120 in the unfolded state. If the stop surface 131 is arranged on the support member 130 on the right side, the stop surface 131 is located on the right side of the bump 120 in the unfolded state.

Figure 9:
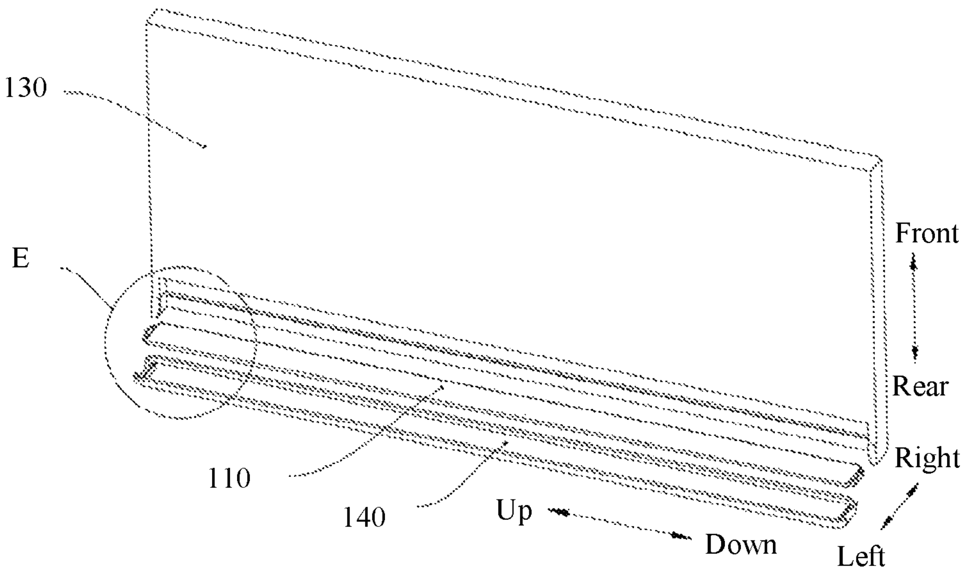
FIG. 9 is a schematic exploded view of another rotating shaft mechanism and a support member in a foldable assembly according to an embodiment of this application.
Figure 10:
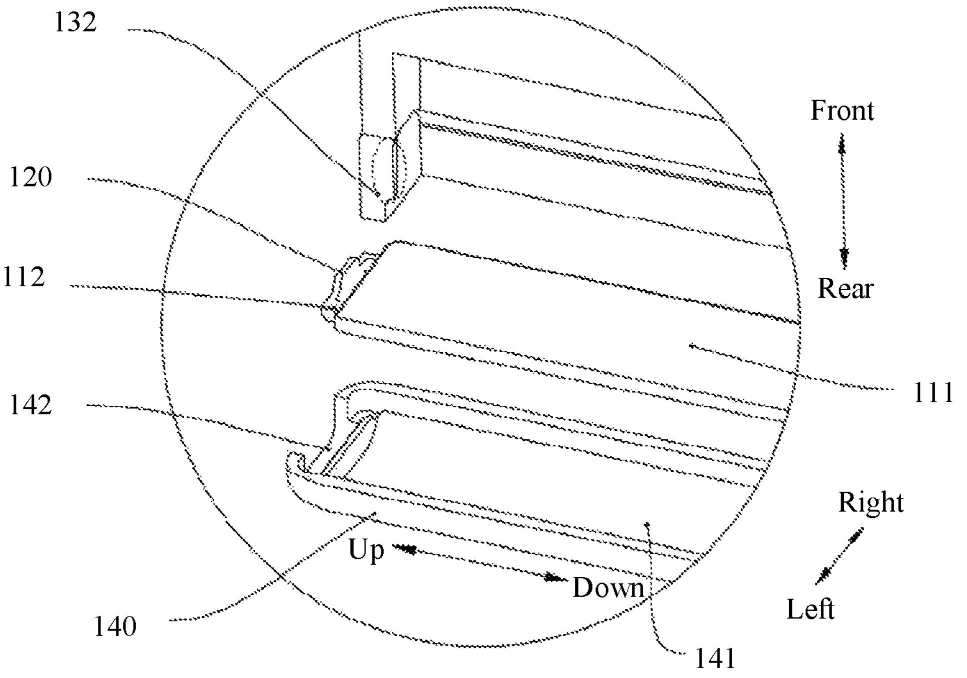
FIG. 10 is an enlarged view at E in FIG. 9.

As shown in FIG. 9 and FIG. 10, in some implementations, the rotating shaft mechanism further includes a decorative member 140, and the decorative member 140 is mounted on an outer side of the rotating shaft substrate 110. The decorative member 140 can improve the aesthetics of a device to which the foldable assembly is applied. Optionally, the decorative member 140 and the rotating shaft substrate 110 are made of different materials. Specifically, the decorative member 140 covers at least the rear side of the rotating shaft substrate 110. For example, the decorative member 140 may be located only on the rear side of the rotating shaft substrate 110. Alternatively, as shown in FIG. 6, the decorative member 140 covers the left side, the rear side, and the right side of the rotating shaft substrate 110. Such an arrangement can reduce or even prevent the rotating shaft substrate 110 from exposure to an outer side of the device to which the foldable assembly is applied.

In this arrangement, because the decorative member 140 is mounted on the outer side of the rotating shaft substrate 110, the decorative member 140 may be used to improve the aesthetics of the rotating shaft mechanism, and the rotating shaft substrate 110 may be made of a material with stronger strength and higher rigidity without considering the aesthetics thereof. For example, the rotating shaft substrate 110 is made of high-strength steel, and the decorative member 140 is made of an aluminum alloy material. It should be noted that the high-strength steel is relative to carbon structural steel, and is generally classified by using Q235 (carbon steel) as a boundary. A low-alloy structural steel is generally referred to as the high-strength steel, that is, structural steel with the strength above Q295 is the high-strength steel. The rotating shaft substrate 110 is manufactured by using the high-strength steel, so that the rotating shaft substrate 110 has higher rigidity and better drop resistance. The bump 120 may be made of a same material as that of the rotating shaft substrate 110. Manufacturing the decorative member 140 by using the aluminum alloy material facilitates appearance shaping, and improves the aesthetics of the device to which the foldable assembly is applied.

The decorative member 140 may be fixedly connected to the support member 130, or may be detachably connected to the support member 130. For example, the decorative member 140 may be connected to the support member 130 by bolts. Alternatively, the decorative member 140 may be connected to the support member 130 by bonding, snapping, welding, or the like.

As shown in FIG. 10, in some implementations, the decorative member 140 includes an accommodating cavity 141, at least a part of a structure of the rotating shaft substrate 110 is located in the accommodating cavity 141, and at least a part of a structure of the bump 120 is located outside the accommodating cavity 141. In this arrangement, the accommodating cavity 141 is provided inside the decorative member 140, so that a coverage range of the decorative member 140 for the rotating shaft substrate 110 is larger, and a thickness of an overall structure of the decorative member 140 and the rotating shaft substrate 110 is smaller.

For example, the decorative member 140 is provided with the accommodating cavity 141 on the front side surface, and an opening of the accommodating cavity 141 is located on a front side of the accommodating cavity 141. During mounting, the rotating shaft substrate 110 is placed into the accommodating cavity 141 from front to back, so that the rotating shaft substrate 110 is completely located in the accommodating cavity 141, and the bump 120 extends out of the opening of the accommodating cavity 141.

Figure 11:
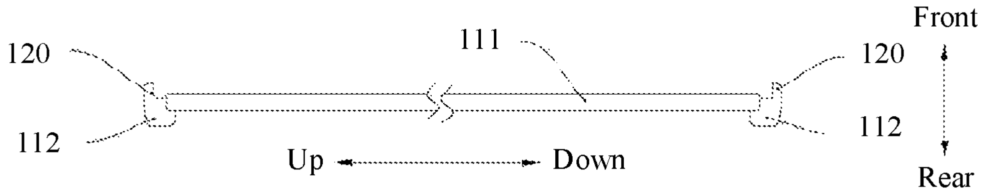
FIG. 11 is a schematic structural diagram of a rotating shaft substrate and a bump in a foldable assembly according to an embodiment of this application.

In an optional implementation, the rotating shaft substrate 110 may be a plate-shaped structure, and the bump 120 is mounted on a front side of the plate-shaped structure. Alternatively, as shown in FIG. 10 and FIG. 11, in another optional implementation, the rotating shaft substrate 110 includes a main body 111 and a connecting body 112, the connecting body 112 is arranged at an end portion of the main body 111 in the length direction, and the bump 120 is arranged on the connecting body 112. For example, there is one connecting body 112 and the connecting body is arranged at one end of the main body 111 in the length direction. Only one bump 120 may be arranged on the connecting body 112, or two bumps 120 may be spaced apart on the connecting body. The two bumps 120 are spaced apart in the width direction of the connecting body 112. In another example, there are two connecting bodies 112, the two connecting bodies 112 are respectively arranged at two ends of the main body 111, and the two connecting bodies 112 are both provided with the bump 120. Quantities of bumps 120 arranged on the two connecting bodies 112 may be the same or different. For example, one bump 120 is arranged on one connecting body 112, and two bumps 120 are arranged on the other connecting body 112. Alternatively, each connecting body 112 is provided with one bump 120, that is, a total quantity of bumps 120 on the rotating shaft substrate 110 is two. Alternatively, each connecting body 112 is provided with two bumps 120, that is, a total quantity of bumps 120 on the rotating shaft substrate 110 is four.

In FIG. 10 and FIG. 11, connecting bodies 112 are respectively arranged at two ends of the main body 111 in the length direction, one bump 120 is arranged on each of two connecting bodies 112, and a thickness of the connecting body 112 is greater than a thickness of the main body 111. Because the bump 120 is connected to the connecting body 112, and a relative thickness of the connecting body 112 is thicker, the rotating shaft substrate 110 has stronger structural rigidity and stronger impact resistance at a position in which the bump 120 is arranged.

In FIG. 10, the main body 111 has a strip-shaped plate-like structure, the connecting bodies 112 are respectively arranged at an upper end and a lower end of the main body 111, and the bumps 120 are respectively arranged on the two connecting bodies 112. A length of the connecting body 112 in the width direction is less than a length of the main body 111 in the width direction, or a length of the connecting body 112 in the left-right direction is less than a length of the main body 111 in the left-right direction. A length of the bump 120 in the width direction is less than a length of the connecting body 112 in the width direction, or a length of the bump 120 in the left-right direction is less than a length of the connecting body 112 in the left-right direction. In FIG. 11, the upper end and the lower end of the main body 111 are respectively provided with the connecting body 112, and the bump 120 protrudes forward from the support surface of the connecting body 112. A horizontal plane on which the front side surface of the bump 120 is located is located above a horizontal plane on which the front side surface of the main body 111 is located, and a horizontal plane on which a rear side surface of the connecting body 112 is located is located below a horizontal plane on which the rear side surface of the main body 111 is located.

Figure 12:
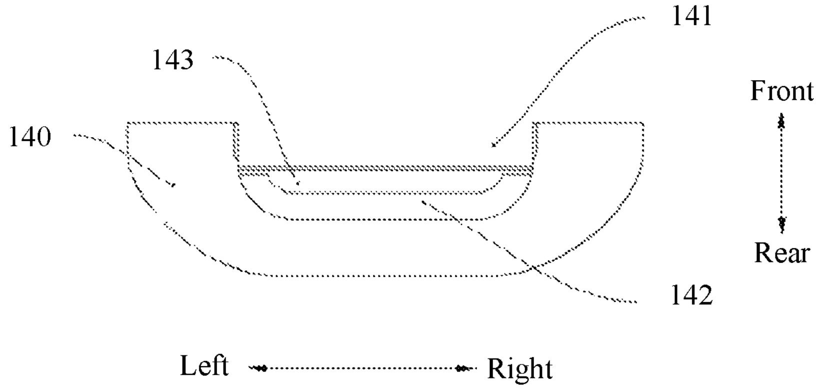
FIG. 12 is a schematic structural diagram of a decorative member in a foldable assembly from one perspective according to an embodiment of this application.
Figure 13:
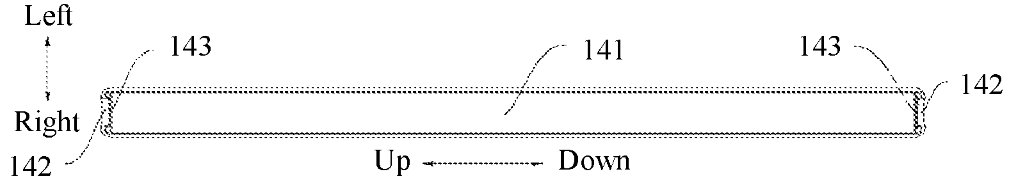
FIG. 13 is a schematic structural diagram of a decorative member in a foldable assembly from another perspective according to an embodiment of this application.

As shown in FIG. 12 and FIG. 13, in some implementations, an end portion of the decorative member 140 in the length direction of the rotating shaft substrate 110 is provided with a bracket 142. The connecting body 112 is limited in the bracket 142, and the bracket 142 plays a certain role in limiting the connecting body 112. The bump 120 protrudes to an outer side of the bracket 142 in the thickness direction of the rotating shaft substrate 110, that is, the front side surface of the bump 120 is located outside the bracket 142. For example, the bump 120 protrudes to the outer side of the bracket 142 in the thickness direction of the rotating shaft substrate 110. In this arrangement, the connecting body 112 having a larger thickness is placed in the bracket 142, so that a thickness of an overall structure of the decorative member 140 and the rotating shaft substrate 110 is smaller, which is convenient for being applied to the foldable display device having a smaller thickness, and a length of the overall structure of the decorative member 140 and the rotating shaft substrate 110 is also smaller. For example, in FIG. 13, one bracket 142 is provided at each of a front end and a rear end of the decorative member 140, and the accommodating cavity 141 is located between two brackets 142.

In a specific implementation, the decorative member 140 may be provided with only the accommodating cavity 141 and not with the bracket 142, or may be provided with only the bracket 142 and not with the accommodating cavity 141. Optionally, as shown in FIG. 13, the decorative member 140 is provided with both the accommodating cavity 141 and the bracket 142. The decorative member 140 is provided with a separating plate 143, and the separating plate 143 separates the bracket 142 from the accommodating cavity 141. As shown in FIG. 13, when there are two brackets 142, there are two separating plates 143. During assembly of the rotating shaft substrate 110 and the decorative member 140, the main body 111 is located between two separating plates 143, and the separating plates 143 support two ends of the main body 111 in the length direction. After the connecting body 112 extends into the bracket 142, the two connecting bodies 112 are respectively located on outer sides of the two separating plates 143, and the separating plates 143 limit the connecting body 112 in the length direction. The decorative member with two brackets 142 shown in FIG. 13 is adapted to the rotating shaft substrate 110 with two connecting bodies 112 (the rotating shaft substrate 110 is shown in FIG. 11).

Figure 14:
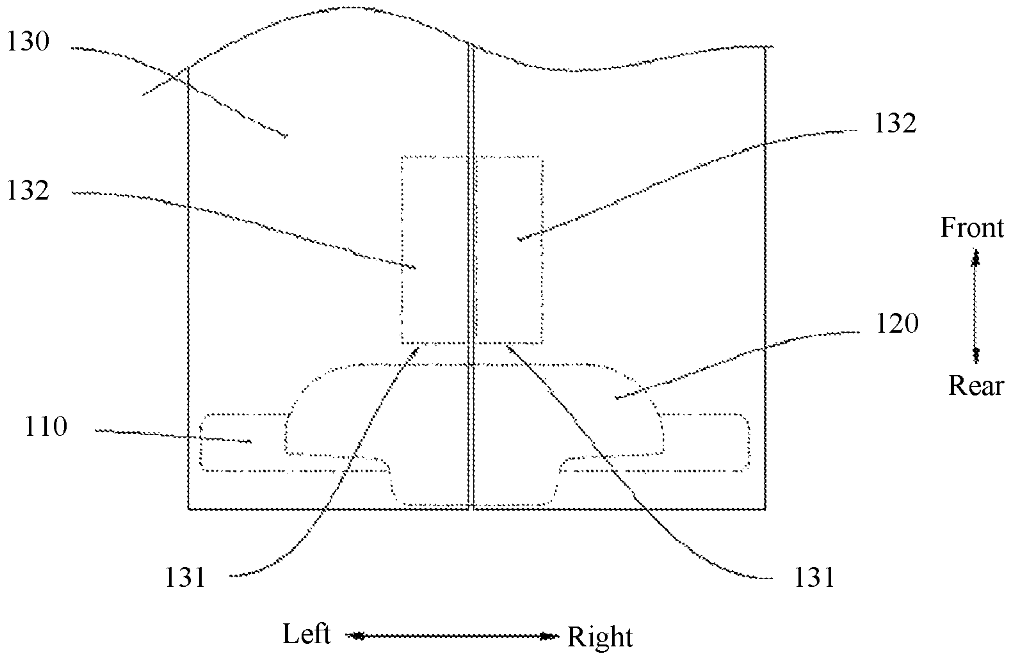
FIG. 14 is a schematic structural diagram of two support members and a rotating shaft mechanism in a folded state in a first foldable assembly according to an embodiment of this application.

FIG. 14 shows a relative positional relationship between a support member and a rotating shaft mechanism in the folded state. A direction perpendicular to a paper surface is a length direction of the rotating shaft substrate 110. Only a relative positional relationship between the bump 120 arranged at a lower end of the rotating shaft substrate 110 and the stop surface 131 of the support member 130 is shown in FIG. 14. As shown in FIG. 14, in an embodiment of this application, two stop surfaces 131 are arranged on each of the two support members 130, and one bump 120 is arranged on each of two ends of the rotating shaft substrate 110 in the length direction, that is, a total of two bumps 120 are arranged on the rotating shaft substrate 110. FIG. 14 shows the bump 120 arranged at the lower end of the rotating shaft substrate 110. In the folded state, a left region of the front side surface of the bump 120 located at the lower end of the rotating shaft substrate 110 and the stop surface 131 of the support member 130 on a left side are spaced apart and opposite to each other in the thickness direction of the rotating shaft substrate 110, and a right region of the front side surface of the bump 120 and the stop surface 131 of the support member 130 on a right side are spaced apart and opposite to each other in the thickness direction of the rotating shaft substrate 110. A left region of the front side surface of the bump 120 located on an upper end of the rotating shaft substrate 110 and the stop surface 131 of the support member 130 on the left side are spaced apart and opposite to each other in the thickness direction of the rotating shaft substrate 110, and a right region of the front side surface of the bump 120 and the stop surface 131 of the support member 130 on the right side are spaced apart and opposite to each other in the thickness direction of the rotating shaft substrate 110. For example, the two support members 130 have the same structure and are symmetrically arranged relative to the rotating shaft substrate 110. One stop surface 131 is arranged at the upper end and the lower end of each of the two support members 130, that is, two stop surfaces 131 are arranged on each support member 130, and a quantity of stop surfaces 131 on the two support members 130 is four. One bump 120 is arranged at both the upper end and the lower end of the rotating shaft substrate 110. That is, the stop surfaces 131 at the upper ends of the two support members 130 are spaced apart and opposite to the same bump 120 at the upper end of the rotating shaft substrate 110, and the stop surfaces 131 at the lower ends of the two support members 130 are spaced apart and opposite to the same bump 120 at the lower end of the rotating shaft substrate 110 in the thickness direction of the rotating shaft substrate 110. Because one bump 120 needs to be opposite to two stop surfaces 131, a width of the bump 120 is longer. After the rotating shaft mechanism is hit, one bump 120 can come into contact with two stop surfaces 131 to transmit the impact force to the two support members 130 through the two stop surfaces 131 respectively. In an implementation, the support blocks 132 are arranged at the upper end and the lower end of the two support members 130, and the stop surfaces 131 are formed on the support blocks 132.

Figure 15:
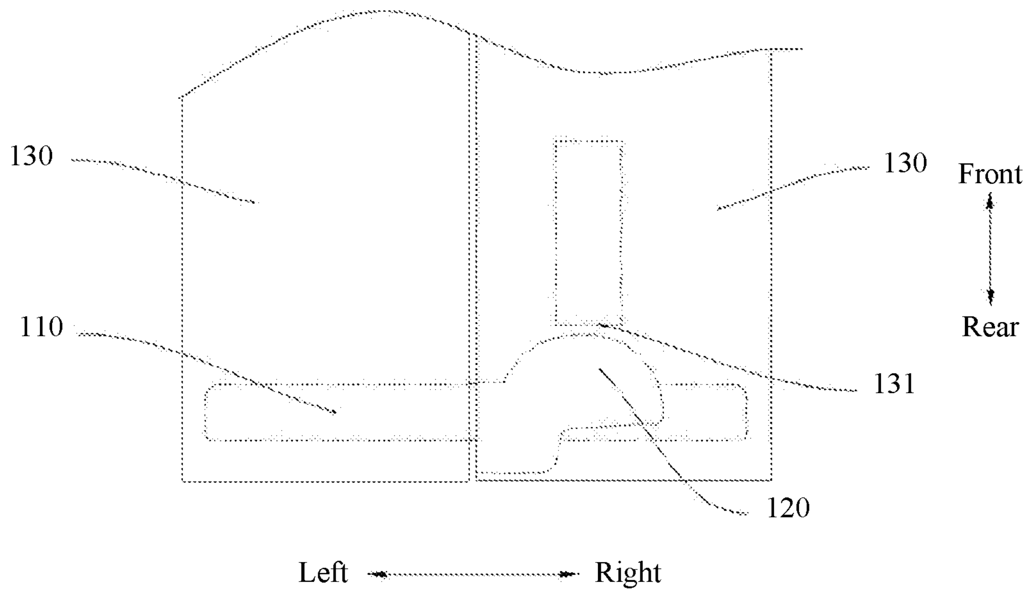
FIG. 15 is a schematic structural diagram of two support members and a rotating shaft mechanism in a folded state in a second foldable assembly according to an embodiment of this application.

FIG. 15 shows another relative positional relationship between a support member and a rotating shaft mechanism in the folded state. A direction perpendicular to a paper surface is a length direction of the rotating shaft substrate 110. Only a relative positional relationship between the bump 120 arranged at the lower end of the rotating shaft substrate 110 and the stop surface 131 of the support member 130 is shown in FIG. 15. As shown in FIG. 15, in another embodiment, one stop surface 131 is arranged on each of the two support members 130, and one bump 120 is arranged on each of two ends of the rotating shaft substrate 110. That is, two bumps 120 are arranged on the rotating shaft substrate 110, and a total of two stop surfaces 131 are arranged on the two support members 130. Specifically; one stop surface 131 is arranged at one end of one support member 130 in the length direction of the rotating shaft substrate 110, and one stop surface 131 is arranged at an other end of the other support member 130 in the length direction of the rotating shaft substrate 110. In the folded state, one bump 120 is spaced apart and opposite to the stop surface 131 of one support member 130, and the other bump 120 is spaced apart and opposite to the stop surface 131 of the other support member 130. For example, one end shown in FIG. 15 is used as the lower end, the lower end of the support member 130 on the left is not provided with the stop surface 131, and the lower end of the support member 130 on the right is provided with the stop surface 131. Because one support member 130 is provided with only one stop surface 131, the upper end of the support member 130 on the left is provided with the stop surface 131, and the upper end of the support member 130 on the right is not provided with the stop surface 131. The bump 120 is arranged on a left side of the upper end of the rotating shaft substrate 110, and the bump 120 is arranged on a right side of the lower end of the rotating shaft substrate 110. Through this arrangement, when an upper end of the rotating shaft mechanism is hit, the rotating shaft mechanism implements a stop operation through the support member 130 on the left side, and disperses the impact force through the support member 130 on the left side. When a lower end of the rotating shaft mechanism is hit, the rotating shaft mechanism implements a stop operation through the support member 130 on the right side, and disperses the impact force through the support member 130 on the right side. In this arrangement, because the bump 120 on the upper end and the lower end of the rotating shaft substrate 110 is only configured to be opposite to the stop surface 131 on one of the support members 130, a width of the bump 120 is smaller, that is, an overall weight of the rotating shaft mechanism is smaller.

Figure 16:
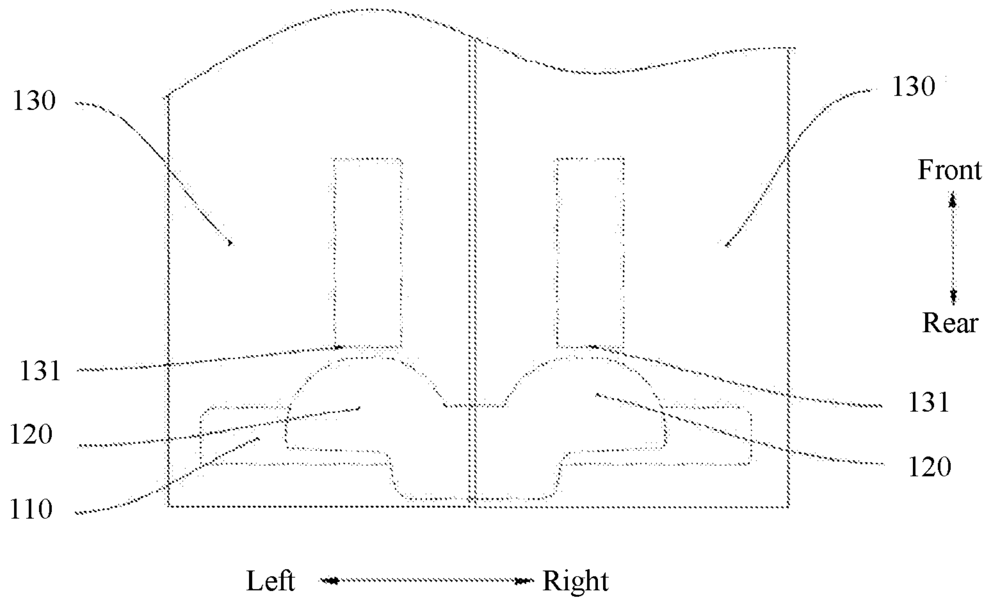
FIG. 16 is a schematic structural diagram of two support members and a rotating shaft mechanism in a folded state in a third foldable assembly according to an embodiment of this application.

FIG. 16 shows a relative positional relationship between a support member and a rotating shaft mechanism in the folded state. A direction perpendicular to a paper surface is a length direction of the rotating shaft substrate 110. Only a relative positional relationship between the bump 120 arranged at a lower end of the rotating shaft substrate 110 and the stop surface 131 of the support member 130 is shown in FIG. 16. As shown in FIG. 16, in still another embodiment, at least one end of the rotating shaft substrate 110 in the length direction is provided with two bumps 120, and the two bumps 120 are spaced apart in the width direction of the rotating shaft substrate 110. That is, only two bumps 120 may be arranged at one end of the rotating shaft substrate 110 in the length direction, and only one bump 120 may be arranged at the other end of the rotating shaft substrate 110 in the length direction, or two bumps 120 spaced apart in the width direction of the rotating shaft substrate 110 may be arranged, or no bump 120 may be arranged. In FIG. 16, two bumps 120 are spaced apart at two ends of the rotating shaft substrate 110 in the width direction, and the stop surfaces 131 are arranged at end portions of the two support members 130 corresponding to the bumps 120 in the length direction of the rotating shaft substrate 110. In the folded state, in the two bumps 120 located at the same end of the rotating shaft substrate 110, one bump 120 and one stop surface 131 of one support member 130 are spaced apart and opposite to each other in the thickness direction of the rotating shaft substrate 110, and the other bump 120 and the stop surface 131 of the other support member 130 are spaced apart and opposite to each other in the thickness direction of the rotating shaft substrate 110. In this arrangement, an arrangement position of the stop surface 131 may be selected based on a structural arrangement requirement of the support member 130, and a position of the bump 120 matching the stop surface 131 on the rotating shaft substrate 110 is arranged based on the arrangement position of the stop surface 131.

Figure 17:
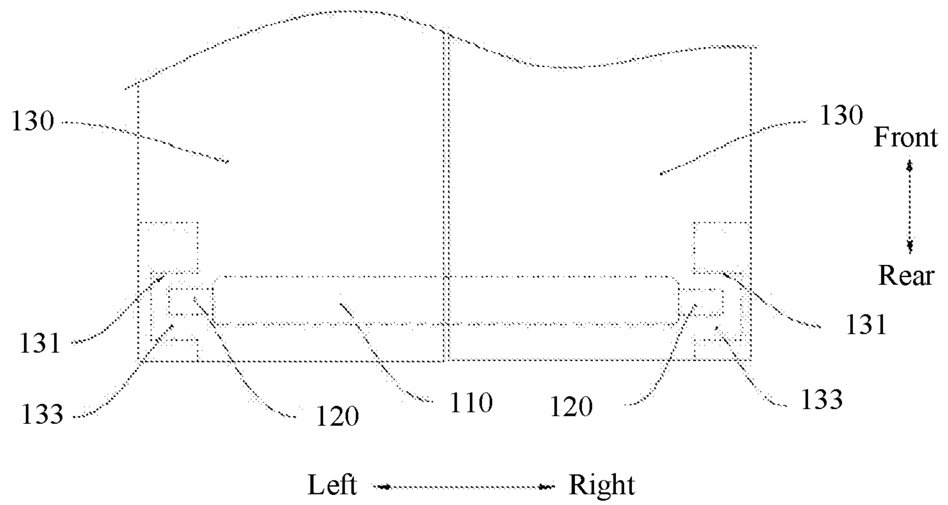
FIG. 17 is a schematic structural diagram of two support members and a rotating shaft mechanism in a folded state in a fourth foldable assembly according to an embodiment of this application.

FIG. 17 shows a relative positional relationship between a support member and a rotating shaft mechanism in the folded state. A direction perpendicular to a paper surface is a length direction of the rotating shaft substrate 110. Only a relative positional relationship between the bump 120 arranged at a lower end of the rotating shaft substrate 110 and the stop surface 131 of the support member 130 is shown in FIG. 17. As shown in FIG. 17, in other embodiments, the bump 120 is arranged on the side surface of the rotating shaft substrate 110 in the width direction and extends in the width direction. For example, the bump 120 may be arranged on a left side surface and/or a right side surface of the rotating shaft substrate 110. The support member 130 is provided with the groove 133 corresponding to the bump 120, and an inner wall of a side of the groove 133 forms the stop surface 131. In the folded state, the bump 120 is located in the groove 133 and is spaced apart and opposite to the stop surface 131 in the thickness direction of the rotating shaft substrate 110. In this arrangement, because the bump 120 is arranged on the side surface of the rotating shaft substrate 110 in the width direction, the arrangement of the bump 120 does not increase the thickness of the rotating shaft mechanism, so that the thickness of the rotating shaft mechanism is smaller. For example, in FIG. 17, an end portion of a left side surface and an end portion of a right side surface of the rotating shaft substrate 110 are both provided with the bump 120, the bump 120 on the left side surface extends to the left, and the bump 120 on the right side surface extends to the right. The support member 130 on the left side is provided with a groove 133 with a rightward opening, and the support member 130 on the right side is provided with a slot with a leftward opening. The state shown in FIG. 17 is the folded state. In the folded state, the bump 120 on the left side is located in the groove 133 of the support member 130 on the left side, and the bump 120 on the right side is located in the groove 133 of the support member 130 on the right side.

In some implementations, a buffer structure is arranged on the stop surface 131 and/or the bump 120. In the folded state, the buffer structure is located between the stop surface 131 and the bump 120. Through the foregoing arrangement, the impact force transmitted by the bump 120 to the stop surface 131 may be buffered to a certain extent by using the buffer structure, thereby reducing the impact force received by the support member 130 provided with the stop surface 131, and improving the anti-impact capability of the foldable assembly. The buffer structure may further absorb the impact force through characteristics such as elastic deformation and collapse deformation of the buffer structure, to reduce the impact force transmitted from the rotating shaft mechanism to the support member 130.

Figure 18:
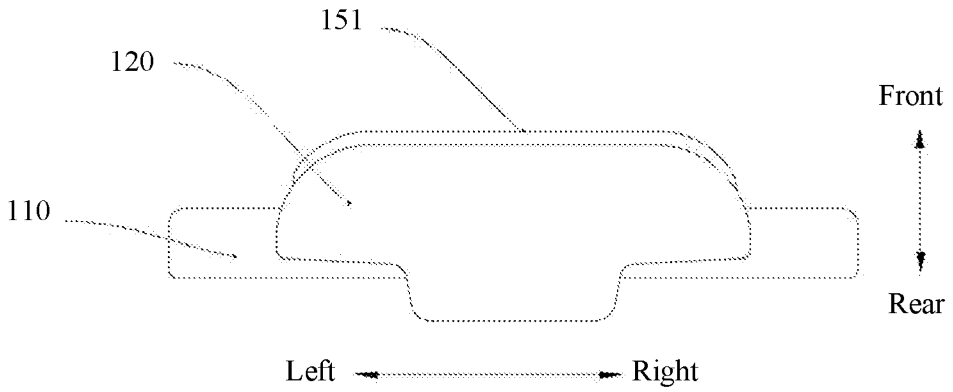
FIG. 18 is a schematic diagram of assembly of a buffer structure and a bump in a foldable assembly according to an embodiment of this application.

As shown in FIG. 18, in a specific implementation, the buffer structure includes a flexible buffer pad 151. Through its own flexible characteristic, the flexible buffer pad 151 deforms under extrusion of the bump 120 and the stop surface 131 during movement of the bump 120 toward the stop surface 131, thereby absorbing part of the impact force. In FIG. 18, the flexible buffer pad 151 is arranged on the front side surface of the bump 120. In other feasible implementations, the flexible buffer pad 151 may be arranged on the stop surface 131. A connection manner between the flexible buffer pad 151 and the bump 120 or the stop surface 131 may be bonding. The flexible buffer pad 151 may be a sheet-shaped structure made of a material such as sponge, silicone, or rubber.

Figure 19:
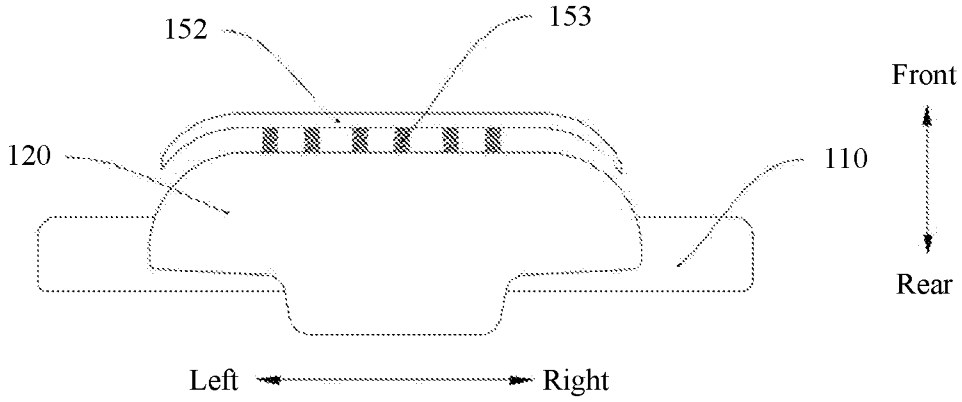
FIG. 19 is a schematic diagram of assembly of another buffer structure and a bump in a foldable assembly according to an embodiment of this application.

In another feasible implementation, as shown in FIG. 19, the buffer structure is mounted on the bump 120. The buffer structure includes a buffer plate 152 and an elastomer 153. The buffer plate 152 and the bump 120 are spaced apart and opposite to each other in the thickness direction of the rotating shaft substrate 110. The elastomer 153 is located between the buffer plate 152 and the bump 120, and the elastomer 153 is connected to the buffer plate 152 and the bump 120 respectively. In the folded state, the buffer plate 152 and the stop surface 131 are spaced apart and opposite to each other in the thickness direction of the rotating shaft substrate 110. Through the foregoing arrangement, during the movement of the bump 120 toward the stop surface 131, the buffer plate 152 first comes into contact with the stop surface 131. The arrangement of the buffer plate 152 can increase a contact area with the stop surface 131, and the elastomer 153 can compress and deform to absorb part of the impact force. In addition, after the impact ends, the elastomer 153 may push the rotating shaft substrate 110 to move away from the flexible screen through elasticity of the elastomer 153, so that the rotating shaft substrate 110 can be reset. In FIG. 19, the elastomer 153 is specifically a spring, and a plurality of springs are arranged between the buffer plate 152 and the bump 120. The elastomer 153 may alternatively be another elastic structure such as a rubber column or an elastic sheet.

This embodiment further provides a foldable display device, including: a flexible screen and the foldable assembly provided in any one of the foregoing embodiments. The flexible screen is laid on two support members 130 in the foldable assembly and covers the support surface of the rotating shaft substrate 110. Optionally, the bump 120 may be located on two sides of the flexible screen in the length direction of the rotating shaft substrate 110. Alternatively, at least one bump 120 is located on one side of the flexible screen in the length direction of the rotating shaft substrate 110, and at least one bump 120 is located on the other side of the flexible screen in the length direction of the rotating shaft substrate 110. Through this arrangement, the bumps 120 and the flexible screen are not opposite to each other in the front-rear direction, or are alternately distributed. When the rotating shaft mechanism is hit, the bump 120 does not squeeze the flexible screen after moving forward.

Because the foldable display device provided in this embodiment includes the foregoing foldable assembly, when the foldable display device falls off in the folded state, if the rotating shaft mechanism is first hit, the stop surface 131 in the foldable mechanism prevents the rotating shaft mechanism from continuing to move toward the flexible screen, and the impact force is dispersed and absorbed by the support member 130, to reduce the impact force that may be transmitted to the flexible screen. Therefore, the problem of damage to the flexible screen caused by the rotating shaft mechanism can be resolved to a certain extent.

The foldable display device provided in this embodiment includes, but is not limited to, a foldable electronic device having a flexible display screen such as a mobile phone, a tablet computer, an electric paper book, and a smartwatch.

When the foldable display device is the mobile phone, the two support members 130 may be respectively two side housings of the mobile phone, the housing includes a middle frame, and the support member may be specifically the middle frame in the housing. Alternatively, in another arrangement, the support member 130 is independent of the housing, and two support members 130 may be respectively connected to two middle frames in the mobile phone in a one-to-one correspondence.

Finally, it should be noted that: The foregoing descriptions are merely specific implementations of this application. However, the protection scope of this application is not limited thereto. Any variation or replacement within the technical scope disclosed in this application shall fall within the protection scope of this application. Therefore, the protection scope of this application shall be subject to the protection scope of the claims.

The invention claimed is:

1. A foldable assembly, comprising:

a rotating shaft mechanism comprising a bump and a rotating shaft substrate, wherein the bump is arranged at an end portion of the rotating shaft substrate in a length direction; and a connecting mechanism comprising two support members that are respectively connected to two sides of the rotating shaft substrate in a width direction, wherein the two support members are respectively rotatable relative to the rotating shaft substrate, so that the foldable assembly is switched between an unfolded state and a folded state, wherein at least one stop surface is arranged on one side of at least one of the two support members close to the rotating shaft substrate, and in the folded state, the bump and the at least one stop surface are spaced apart and opposite to each other in a thickness direction of the rotating shaft substrate, wherein, in the folded state, the two support members are located on a front side of the rotating shaft substrate, the at least one stop surface is located on a front side of the bump, and a spacing between the bump and a corresponding stop surface of the at least one stop surface in the thickness direction ranges from 0.1 millimeter (mm) to 0.5 mm, and wherein the bump is configured to come into contact with the corresponding stop surface after the rotating shaft substrate drives the bump forward in the thickness direction, so that the corresponding stop surface prevents the bump from continuing to move forward in the thickness direction and an impact force received by the rotating shaft mechanism is transmitted to the at least one of the two support members through contact between the bump and the corresponding stop surface.

2. The foldable assembly of claim 1, wherein the at least one of the two support members comprises:

a support substrate connected to one side of the rotating shaft substrate in the width direction, wherein the support substrate is rotatable relative to the rotating shaft substrate; and a support block arranged on one side of the support substrate close to the rotating shaft substrate, wherein one side surface of the support block is the stop surface corresponding stop surface.

3. The foldable assembly of claim 1, wherein the rotating shaft substrate comprises a support surface that is configured to support a to-be-supported object, and the bump is arranged on the support surface of the rotating shaft substrate.

4. The foldable assembly of claim 3, wherein the rotating shaft mechanism comprises two bumps including the bump, one of the two bumps being arranged at each of both ends of the rotating shaft substrate in the length direction, wherein the at least one stop surface comprises stop surfaces arranged at both ends of each of the support members in the length direction, and wherein, in the folded state, each of the two bumps and the stop surfaces of the two support members are spaced apart and opposite to each other in the thickness direction of the rotating shaft substrate.

5. The foldable assembly of claim 3, wherein the rotating shaft mechanism comprises two bumps including the bump, one of the two bumps being arranged at each of both ends of the rotating shaft substrate in the length direction, wherein the at least one stop surface comprises two stop surfaces including one stop surface arranged at an end of one of the two support members in the length direction of the rotating shaft substrate, and another stop surface is arranged at another end of the other of the two support members in the length direction of the rotating shaft substrate, and wherein, in the folded state, one of the two bumps and the stop surface of one of the support members are spaced apart and opposite to each other in the thickness direction of the rotating shaft substrate, and the other of the two bumps and the stop surface of the other of the support members are spaced apart and opposite to each other in the thickness direction of the rotating shaft substrate.

6. The foldable assembly of claim 3, wherein the rotating shaft mechanism comprises two bumps including the bump, the two bumps being arranged at at least one end of the rotating shaft substrate in the length direction, the two bumps are spaced apart in the width direction of the rotating shaft substrate, and the at least one stop surface comprises stop surfaces arranged at end portions of the two support members corresponding to the bumps in the length direction of the rotating shaft substrate, and wherein, in the folded state, one of the bumps and the stop surface of one of the support members are spaced apart and opposite to each other in the thickness direction of the rotating shaft substrate, and the other of the bumps and the stop surface of the other of the support members are spaced apart and opposite to each other in the thickness direction of the rotating shaft substrate.

7. The foldable assembly of claim 1, wherein the bump is arranged on a side surface of the rotating shaft substrate in the width direction, the at least one of the two support members is provided with a groove, and an inner wall of one side of the groove forms the corresponding stop surface, and wherein, in the folded state, the bump is located in the groove and is spaced apart and opposite to the corresponding stop surface in the thickness direction of the rotating shaft substrate.

8. The foldable assembly of claim 1, wherein the rotating shaft mechanism further comprises a decorative member that is mounted on an outer side of the rotating shaft substrate.

9. The foldable assembly of claim 8, wherein the decorative member comprises an accommodating cavity, at least a part of a structure of the rotating shaft substrate is located in the accommodating cavity, and at least a part of a structure of the bump is located outside the accommodating cavity.

10. The foldable assembly of claim 8, wherein the rotating shaft substrate comprises a main body and a connecting body, an end portion of the main body in the length direction is provided with the connecting body, the bump is arranged on the connecting body, and a thickness of the connecting body is greater than a thickness of the main body.

11. The foldable assembly of claim 10, wherein a bracket is provided at an end portion of the decorative member in the length direction of the rotating shaft substrate, the connecting body is limited in the bracket, and the bump protrudes from the bracket in the thickness direction of the rotating shaft substrate.

12. The foldable assembly of claim 1, wherein a buffer structure is arranged on the corresponding stop surface and/or the bump, and in the folded state, the buffer structure is located between the corresponding stop surface and the bump.

13. The foldable assembly of claim 12, wherein the buffer structure comprises a flexible buffer pad.

14. The foldable assembly of claim 12, wherein the buffer structure is mounted on the bump, the buffer structure comprises a buffer plate and an elastomer, the buffer plate and the bump are spaced apart and opposite to each other in the thickness direction of the rotating shaft substrate, the elastomer is located between the buffer plate and the bump, the elastomer is connected to the buffer plate and the bump respectively, and in the folded state, the buffer plate and the corresponding stop surface are spaced apart and opposite to each other in the thickness direction of the rotating shaft substrate.

15. A foldable display device, comprising:

a foldable assembly, comprising:

a rotating shaft mechanism comprising a bump and a rotating shaft substrate, wherein the bump is arranged at an end portion of the rotating shaft substrate in a length direction;

a connecting mechanism comprising two support members that are respectively connected to two sides of the rotating shaft substrate in a width direction, wherein the two support members are respectively rotatable relative to the rotating shaft substrate, so that the foldable assembly is switched between an unfolded state and a folded state, wherein at least one stop surface is arranged on one side of at least one of the two support members close to the rotating shaft substrate, and in the folded state, the bump and the at least one stop surface are spaced apart and opposite to each other in a thickness direction of the rotating shaft substrate, wherein, in the folded state, the two support members are located on a front side of the rotating shaft substrate, the at least one stop surface is located on a front side of the bump, and a spacing between the bump and a corresponding stop surface of the at least one stop surface in the thickness direction ranges from 0.1 millimeter (mm) to 0.5 mm; and a flexible screen that is laid on the two support members in the foldable assembly and that covers a support surface of the rotating shaft substrate, wherein the bump is configured to come into contact with the corresponding stop surface after the rotating shaft substrate drives the bump toward the flexible screen in the thickness direction, so that the corresponding stop surface prevents the bump from continuing to move toward the flexible screen in the thickness direction and an impact force received by the rotating shaft mechanism is transmitted to the at least one of the two support members through contact between the bump and the corresponding stop surface.

16. The foldable display device of claim 15, wherein the at least one of the two support members comprises:

a support substrate connected to one side of the rotating shaft substrate in the width direction, wherein the support substrate is rotatable relative to the rotating shaft substrate; and a support block arranged on one side of the support substrate close to the rotating shaft substrate, wherein one side surface of the support block is the corresponding stop surface.

17. The foldable display device of claim 15, wherein the rotating shaft substrate comprises a support surface that is configured to support a to-be-supported object, and the bump is arranged on the support surface of the rotating shaft substrate.

18. The foldable display device of claim 17, wherein the rotating shaft mechanism comprises two bumps including the bump, one of the two bumps being arranged at each of both ends of the rotating shaft substrate in the length direction, wherein the at least one stop surface comprises stop surfaces arranged at both ends of each of the support members in the length direction, and wherein, in the folded state, each of the two bumps and the stop surfaces of the two support members are spaced apart and opposite to each other in the thickness direction of the rotating shaft substrate.

19. The foldable display device of claim 17, wherein the rotating shaft mechanism comprises two bumps including the bump, one of the two bumps being arranged at each of both ends of the rotating shaft substrate in the length direction, wherein the at least one stop surface comprises two stop surfaces including one stop surface arranged at an end of one of the two support members in the length direction of the rotating shaft substrate, and another stop surface is arranged at another end of the other of the two support members in the length direction of the rotating shaft substrate, and wherein, in the folded state, one of the two bumps and the stop surface of one of the support members are spaced apart and opposite to each other in the thickness direction of the rotating shaft substrate, and the other of the two bumps and the stop surface of the other of the support members are spaced apart and opposite to each other in the thickness direction of the rotating shaft substrate.

20. The foldable display device of claim 17, wherein the rotating shaft mechanism comprises two bumps including the bump, the two bumps being arranged at at least one end of the rotating shaft substrate in the length direction, the two bumps are spaced apart in the width direction of the rotating shaft substrate, and the at least one stop surface comprises stop surfaces arranged at end portions of the two support members corresponding to the bumps in the length direction of the rotating shaft substrate, and wherein, in the folded state, one of the bumps and the stop surface of one of the support members are spaced apart and opposite to each other in the thickness direction of the rotating shaft substrate, and the other of the bumps and the stop surface of the other of the support members are spaced apart and opposite to each other in the thickness direction of the rotating shaft substrate.

* * * * *